(12) United States Patent
Shukla et al.

(10) Patent No.: US 8,340,227 B2
(45) Date of Patent: Dec. 25, 2012

(54) TECHNIQUES TO IMPROVE DIGITAL DEMODULATOR PERFORMANCE UTILIZING AUTOMATIC GAIN CONTROL TARGET ADJUSTMENT

(75) Inventors: Parveen K Shukla, Nottingham (GB); Bernard Arambepola, Middlesex (GB); Thushara Hewavithana, Borehamwood (GB)

(73) Assignee: Intel Corporation, Santa Clara, CA (US)

( * ) Notice: Subject to any disclaimer, the term of this patent is extended or adjusted under 35 U.S.C. 154(b) by 947 days.

(21) Appl. No.: 12/229,673

(22) Filed: Aug. 25, 2008

(65) Prior Publication Data

US 2010/0046678 A1 Feb. 25, 2010

(51) Int. Cl.
*H04L 27/08* (2006.01)

(52) U.S. Cl. .......... 375/345; 375/260; 375/267
(58) Field of Classification Search .......... 375/316, 375/345, 260, 267
See application file for complete search history.

(56) References Cited

U.S. PATENT DOCUMENTS 6,668,027 B1* 12/2003 Scarpa .......... 375/345
2002/0131533 A1* 9/2002 Koizumi .......... 375/345

* cited by examiner

*Primary Examiner* — Sam K Ahn
*Assistant Examiner* — Freshteh N Aghdam
(74) *Attorney, Agent, or Firm* — Ellis B. Ramirez

(57) ABSTRACT

An embodiment of the present invention provides an apparatus, comprising a digital demodulator including an automatic gain control (AGC) circuit with a self-adapting target to provide optimum performance under all signal conditions.

21 Claims, 2 Drawing Sheets

TECHNIQUES TO IMPROVE DIGITAL DEMODULATOR PERFORMANCE UTILIZING AUTOMATIC GAIN CONTROL TARGET ADJUSTMENT

BACKGROUND

A digital demodulator (such as, but not limited to digital television (TV) demodulators) digitizes an Intermediate Frequency or a base-band signal using an Analog to Digital Converter (ADC). The signal level at the input to the ADC has to be carefully controlled, especially in the presence of high power adjacent channels. If the signal level is too low, quantization noise of the ADC can become too high. If the signal level is too high, clipping or saturation non-linearities can degrade performance.

The signal level at the input of the ADC is controlled using an Automatic Gain Control (AGC) circuit after the ADC. The function of the AGC circuit is to make the average signal amplitude or power level equal to a specified target.

It has been observed that in prior art demodulators setting this target to a fixed level does not optimize performance for all operating conditions. For example, when there is high analog adjacent channel interference (ACI), the target has to be reduced to get best performance. When there is no such ACI, the performance can be improved by increasing the target level.

Note that digital TV or communication systems can have high power ACI for two reasons. Firstly, the transmitted powers of digital channels are kept deliberately low to prevent interference to existing analog receivers. Secondly, the user may be tuned to a digital channel from a distant transmitter while there could be a high power analog or digital channel in the adjacent frequency from a nearby transmitter.

Hence if the AGC is designed with a fixed target, then to cope with high ACI, this target has to be set to a smaller value. However, in most situations this worst case will never occur and hence the demodulator will be operating in sub-optimal conditions.

Thus, a strong need exists for techniques to improve digital demodulator performance.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
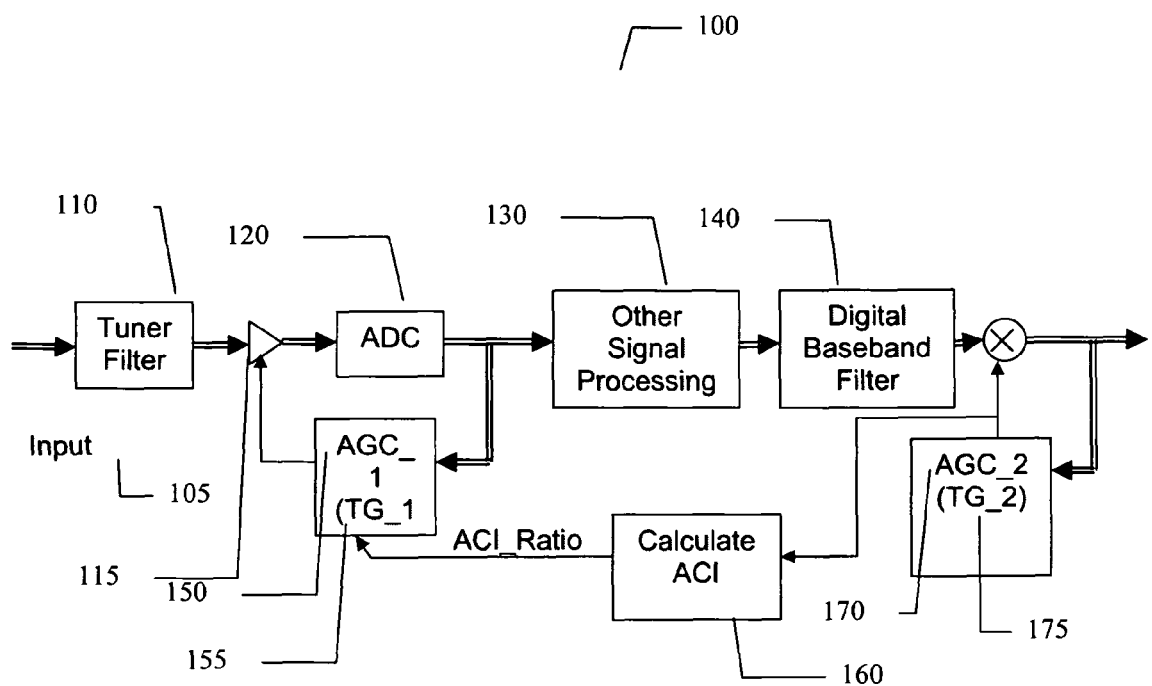
FIG. 1 provides a simplified block diagram of the front-end portion of a digital TV receiver of an embodiment of the invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the preset invention may be practiced without these specific details. In other instances, well-known methods, procedures, components and circuits have not been described in detail so as not to obscure the present invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations.

Embodiments of the present invention provide that in the AGC is a self-adapting target to provide optimum performance under all signal conditions. Embodiments herein may provide an algorithm for the AGC to automatically adjust its own target, which may be based on measuring simple statistics of the signal. For example, but not limited in this respect, the number of times the signal exceeds a given threshold is counted and whether the signal falls below another threshold, over a long period. Based on these statistics, embodiments of the present invention work out a simple algorithm for automatic AGC target adjustment.

Automatic target adjustment is not required when there is no significant ACI. Hence, an embodiment of the present invention provides another circuit to automatically work out the ACI level observed by the demodulator. Only when there is significant ACI does the present invention enable automatic AGC target updates.

An algorithm has been simulated in a complete digital terrestrial TV demodulator model implementing DVB-T, DVB-H, DAB and T-DMB broadcast standards and is consistent with use also in a digital communication system. Embodiments of the present invention have shown that automatic AGC target adjustment and the associated algorithm, do lead to improvements in bit error rate performance.

Turning now to FIG. 1, shown generally as 100, is a simplified block diagram of the front-end portion of a digital TV receiver. The analog input 105 may be an OFDM signal, which may be complex if the system has a zero-IF type input (as indicated by "double" lines of FIG. 1). If the input is of an IF-type, then the signal is real up to the block "Other Signal Processing" 130, after which it is then complex. Whether the input is real or complex may not actually be a critical factor herein.

The input is sampled by an ADC 120, with the amplifier gain 115 at the input to the ADC 120 being controlled by an automatic gain control block labeled AGC_1 150. The block AGC_1 150 controls the dynamic level of the sampled signal by ensuring the average magnitude is as close as possible to a target value, denoted TG_1 155. Normally TG_1 155 would be set according to the statistical nature of the input, and would remain fixed. For example, if the input is purely an OFDM signal sent over a static transmission channel, then it would generally have a Gaussian type distribution and one could set TG_1 155 such that the probability of the signal exceeding the maximum ADC output level would be around $10^{-5}$, or 1 "clip" in 100,000. The problem arises if the overall statistical nature of the input signal changes, causing a large amount of clipping at the ADC 120 output and thus a serious degradation in performance. In such instances a reduction in TG_1 155 would be required to remedy this.

An example of when the statistical nature of the signal can be different (from static OFDM) is in the presence of ACI. This has been observed, for example, when receiving a frequency-offset 7 MHz OFDM plus adjacent GPAL signal via a tuner filter of 8 MHz bandwidth. The tuner filter does remove a large part of the adjacent channel power but, because it is wider than the OFDM signal, a significant amount of ACI is still allowed through, thus affecting the signal statistics. It is this residual ACI component that is of concern here (this ACI is eventually removed by the digital baseband filter 140). Sometimes the presence of large ACI does not cause clipping, but because the OFDM signal is such a small part of the overall input signal, raising the target TG_1 155 can improve performance. This was observed, for example, when receiving 8 MHz OFDM plus adjacent IPAL via a tuner filter of 8 MHz bandwidth.

In order to achieve optimum performance at all times, a method is required by which TG_1 155 can be automatically adjusted. The method described here is based on measuring the frequency of "clips" at the ADC 120 output.

The frequency of clips at the ADC 120 output is regular for the case of ACI being the cause, and target adjustment may sometimes be desired only for when ACI is present. For this reason it is useful to have a measure of the ACI present in the system, and thence only allow target adjustment if this exceeds some threshold. Of course this threshold can be made zero, in which case target adjustment is allowed under all situations. The measurement of ACI is performed by means of a digital baseband filter 140 and second AGC, denoted AGC_2 170, which in contrast to AGC_1 150 operates solely in the digital domain.

The "Other Signal Processing" 130 block in FIG. 1 may include such functions as DC rejection, tuner filter IQ imbalance correction, frequency offset compensation (to bring the signal to baseband if required), etc.

The function of the digital baseband filter 140 is to remove any ACI. The signal at the input to the filter contains two parts, one being the desired OFDM component, and the other being the unwanted ACI component (the ACI component is the residual adjacent channel interference that the tuner filter 110 did not remove). The quantity ACI_Ratio is defined as the ratio of the power of the ACI component to the power of the OFDM component, i.e ACI_Ratio=(ip_pow−op_pow)/op_pow=(ip_pow/op_pow)−1, where ip_pow and op_pow are the input and output signal powers respectively of the digital filter 140. If ACI_Ratio=0, then this would imply there is no ACI present at the input to the digital filter 140. If there is significant ACI present, then the output from the digital filter 140 will be significantly lower in energy than the input. The power level of the output is restored by AGC_2 170, which aims to ensure the average magnitude is close to the target value TG_2 175.

A method for calculating ACI_Ratio would be to explicitly measure the input and output powers of the digital baseband filter 140, take their ratio, and subtract 1. A simpler alternative method can be employed if it is assumed that the "Other Signal Processing" block in FIG. 1 does not significantly alter the power level of the signal, so that it can be assumed the input and output have the same average energy, or equivalently that the output is constrained to the same target value TG_1 155 (this assumption is quite reasonable). Using this method, the value of ACI_Ratio can be calculated 160 from knowledge of TG_1 155, TG_2 175 and the gain applied by AGC_2 170. This can be seen from a simple example. Suppose TG_2=TG_1, then if no ACI is present the input and output powers of the baseband filter should be the same, in which case the applied gain from AGC_2 should be unity, or 0 dB. If ACI were present, then the gain would have to be positive, and the amount of gain would be proportional to the amount of ACI present. Using this alternative method, the quantity ACI_Ratio is calculated as:

$$ACI\_Ratio=(AGC\_2\_gain \times TG\_1/TG\_2)^2-1$$

Figure 2:
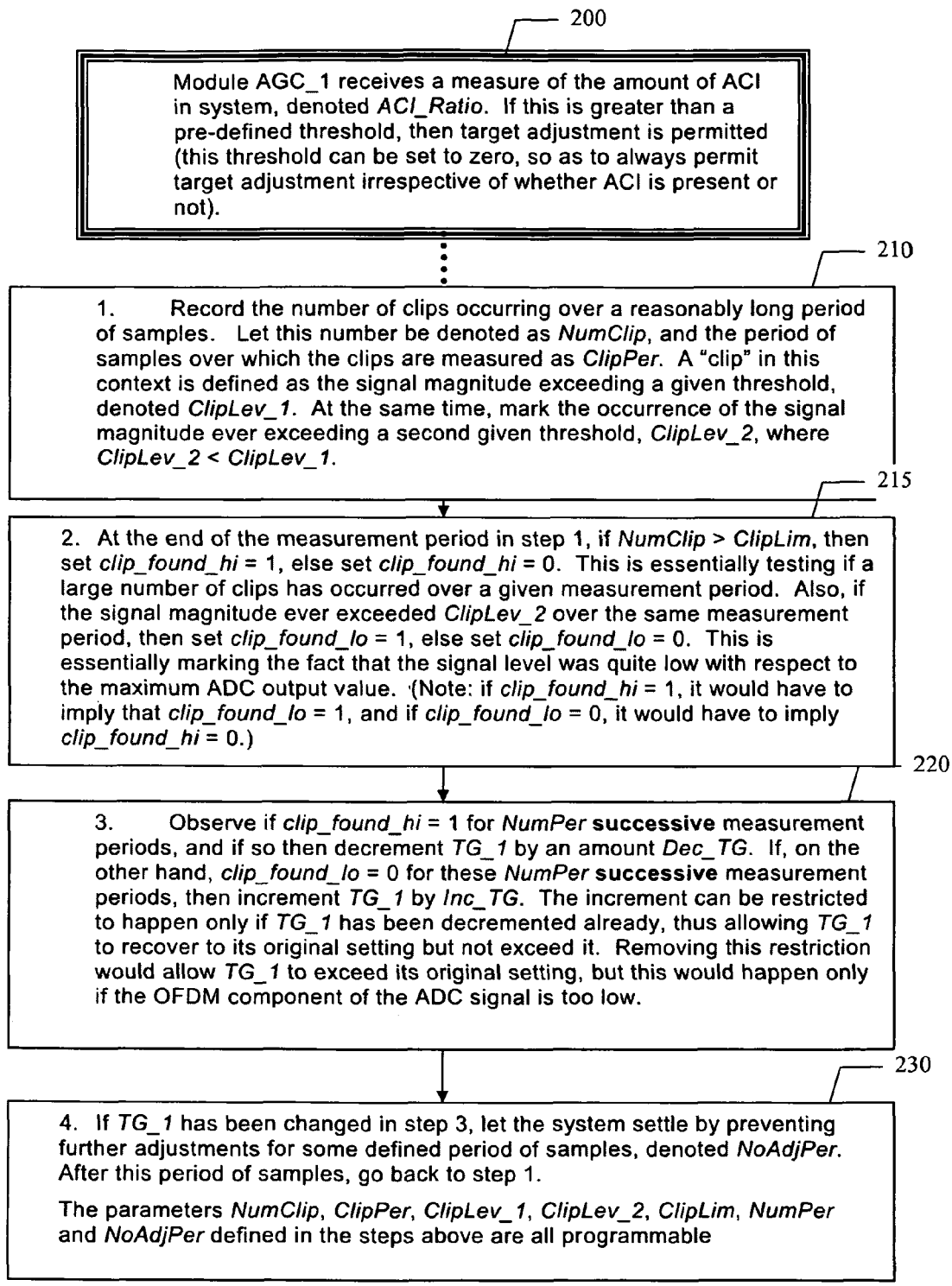
FIG. 2 illustrates a method according to an embodiment of the present invention.

Looking now at FIG. 2 is an algorithm of an embodiment of the present invention, wherein at 200 the module AGC_1 receives a measure of the amount of ACI in system, denoted ACI_Ratio. If this is greater than a pre-defined threshold, then target adjustment is permitted (this threshold can be set to zero, so as to always permit target adjustment irrespective of whether ACI is present or not). The steps are as follows.

1 (210). Record the number of clips occurring over a reasonably long period of samples. Let this number be denoted as NumClip, and the period of samples over which the clips are measured as ClipPer. A "clip" in this context is defined as the signal magnitude exceeding a given threshold, denoted ClipLev_1. At the same time, mark the occurrence of the signal magnitude ever exceeding a second given threshold, ClipLev_2, where ClipLev_2<ClipLev_1.

2 (215). At the end of the measurement period in step 1, if NumClip>ClipLim, then set clip_found_hi=1, else set clip_found$_{hi=}$0. This is essentially testing if a large number of clips has occurred over a given measurement period. Also, if the signal magnitude ever exceeded ClipLev_2 over the same measurement period, then set clip_found_lo=1, else set clip_found$_{lo=}$0. This is essentially marking the fact that the signal level was quite low with respect to the maximum ADC output value. (Note: if clip_found_hi=1, it would have to imply that clip_found_lo=1, and if clip_found_lo=0, it would have to imply clip_found_hi=0.)

3 (220). Observe if clip_found_hi=1 for NumPer successive measurement periods, and if so then decrement TG_1 by an amount Dec_TG. If, on the other hand, clip_found_lo=0 for these NumPer successive measurement periods, then increment TG_1 by Inc_TG. The increment can be restricted to happen only if TG_1 has been decremented already, thus allowing TG_1 to recover to its original setting but not exceed it. Removing this restriction would allow TG_1 to exceed its original setting, but this would happen only if the OFDM component of the ADC signal is too low.

4 (230). If TG_1 has been changed in step 3, let the system settle by preventing further adjustments for some defined period of samples, denoted NoAdjPer. After this period of samples, go back to step 1.

The parameters NumClip, ClipPer, ClipLev_1, ClipLev_2, ClipLim, NumPer and NoAdjPer defined in the steps above are all programmable.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

We claim:

1. An apparatus, comprising:
a digital demodulator including an automatic gain control (AGC) circuit with a self-adapting target value to provide optimum performance under all signal conditions; and
an ACI ratio circuit to provide the AGC with an ACI ratio representing a measurement of adjacent channel interference (ACI) in an input signal;
wherein the target value is automatically adjusted if the ACI ratio exceeds a predetermined value;
wherein the ACI ratio is based on an equation:

$$ACI\_Ratio = \left(\frac{AGC\_2\_Gain * TG\_1}{TG\_2}\right)^2 - 1$$

where ACI Ratio is a measure of the amount of ACI in system, AGC 2 Gain is the gain applied by a second automatic gain controller, TG 1 is a first target value, and TG 2 is a second target value as generated by the second automatic gain controller.

2. The apparatus of claim 1, wherein said digital demodulator is a television (TV) digital demodulator or a demodulator for a digital communication system.

3. The apparatus of claim 1, wherein said automatic gain control is based on measuring statistics of the input signal.

4. The apparatus of claim 1, further comprising at least one additional circuit to automatically work out an adjacent channel interference (ACI) level observed by said demodulator, wherein the input signal is an orthogonal frequency-division multiplexing (OFDM) signal.

5. The apparatus of claim 3, wherein said statistics of the input signal is counting the number of times said input signal exceeds a given threshold and whether said signal falls below another threshold.

6. The apparatus of claim 2, wherein said digital television demodulator is a complete digital terrestrial TV demodulator model implementing DVB-T, DVB-H, DAB and T-DMB broadcast standards.

7. The apparatus of claim 4, wherein said ACI level is estimated by using the gain of a second AGC included in said apparatus.

8. A method, comprising:
using an automatic gain control (AGC) circuit with a self-adapting target value in a digital demodulator to provide optimum performance under all signal conditions; and
receiving at the AGC an ACI ratio representing a measurement of adjacent channel interference (ACI) in an input signal;
wherein the target value is automatically adjusted if the ACI ratio exceeds a predetermined value;
wherein the ACI ratio is based on an equation:

$$ACI\_Ratio = \left(\frac{AGC\_2\_Gain * TG\_1}{TG\_2}\right)^2 - 1$$

where ACI Ratio is a measure of the amount of ACI in system, AGC 2 Gain is the gain applied by a second automatic gain controller, TG 1 is a first target value, and TG 2 is a second target value as generated by the second automatic gain controller.

9. The method of claim 8, wherein said digital demodulator is a television (TV) digital demodulator or a demodulator for a digital communication system.

10. The method of claim 8, further comprising basing said automatic gain control on measuring statistics of the input signal.

11. The method of claim 8, further comprising using at least one additional circuit to automatically work out an adjacent channel interference (ACI) level observed by said digital demodulator, wherein the input signal is an orthogonal frequency-division multiplexing (OFDM) signal.

12. The method of claim 10, wherein said statistics of the input signal is counting the number of times said input signal exceeds a given threshold and whether said signal falls below another threshold.

13. The method of claim 9, wherein said digital television demodulator is a complete digital terrestrial TV demodulator model implementing DVB-T, DVB-H, DAB and T-DMB broadcast standards.

14. The method of claim 11, further comprising estimating said ACI by using the gain of a second AGC included in said digital demodulator.

15. A non-transitory machine-accessible medium that provides instructions, which when accessed, cause a machine to perform operations comprising:
using an automatic gain control (AGC) circuit with a self-adapting target in a digital demodulator to provide optimum performance under all signal conditions;
receiving at the AGC an ACI ratio representing a measurement of adjacent channel interference (ACI) in an input signal;
wherein the target value is automatically adjusted if the ACI ratio exceeds a predetermined value;
wherein the ACI ratio is based on an equation:

$$ACI\_Ratio = \left(\frac{AGC\_2\_Gain * TG\_1}{TG\_2}\right)^2 - 1$$

where $ACI_{13}Ratio$ is a measure of the amount of ACI in system, $AGC\_2\_Gain$ is the gain applied by a second automatic gain controller, $TG\_1$ is a first target value, and $TG\_2$ is a second target value as generated by the second automatic gain controller.

16. The non-transitory machine-accessible medium of claim 15, further comprising said instructions causing said machine to perform operations further comprising basing said automatic gain control on measuring statistics of an input signal.

17. The non-transitory machine-accessible medium of claim 15, further comprising said instructions causing said machine to perform operations further comprising using at least one additional circuit to automatically work out an adjacent channel interference (ACI) level observed by said demodulator and enabling said automatic AGC target updates only when there is significant ACI.

18. The non-transitory machine-accessible medium of claim 15, wherein said statistics of an input signal is counting the number of times said signal exceeds a given threshold and whether said signal falls below another threshold.

19. The non-transitory machine-accessible medium of claim 15, wherein said digital demodulator is a digital television demodulator in a complete digital terrestrial TV demodulator model implementing DVB-T, DVB-H, DAB and T-DMB broadcast standards.

20. The non-transitory machine-accessible medium of claim 17, further comprising said instructions causing said machine to perform operations further comprising estimating said ACI by using the gain of a second AGC included in said digital demodulator.

21. The non-transitory machine-accessible medium of claim 15, further comprising said instructions causing said machine to perform operations further comprising wherein the input signal is an orthogonal frequency-division multiplexing (OFDM) signal.

* * * * *

UNITED STATES PATENT AND TRADEMARK OFFICE
CERTIFICATE OF CORRECTION

PATENT NO. : 8,340,227 B2
APPLICATION NO. : 12/229673
DATED : December 25, 2012
INVENTOR(S) : Parveen K Shukla et al.

Page 1 of 1

It is certified that error appears in the above-identified patent and that said Letters Patent is hereby corrected as shown below:

In column 5, line 26, in claim 1, delete "ACI Ratio" and insert -- ACI_Ratio --, therefor.

In column 5, line 27, in claim 1, delete "AGC 2 Gain" and insert -- AGC_2_Gain --, therefor.

In column 5, line 28, in claim 1, delete "TG 1" and insert -- TG_1 --, therefor.

In column 5, line 29, in claim 1, delete "TG 2" and insert -- TG_2 --, therefor.

In column 6, line 1, in claim 8, delete "ACI Ratio" and insert -- ACI_Ratio --, therefor.

In column 6, line 2, in claim 8, delete "AGC 2 Gain" and insert -- AGC_2_Gain --, therefor.

In column 6, line 3, in claim 8, delete "TG 1" and insert -- TG_1 --, therefor.

In column 6, line 4, in claim 8, delete "TG 2" and insert -- TG_2 --, therefor.

In column 6, line 50, in claim 15, delete "$ACI_{13}Ratio$" and insert -- ACI_Ratio --, therefor.

Signed and Sealed this
Twelfth Day of March, 2013

Teresa Stanek Rea
*Acting Director of the United States Patent and Trademark Office*